US008605037B2

(12) United States Patent
Philipp et al.

(10) Patent No.: US 8,605,037 B2
(45) Date of Patent: Dec. 10, 2013

(54) NOISE REDUCTION IN CAPACITIVE TOUCH SENSORS

(75) Inventors: Harald Philipp, Southampton (GB); Esat Yilmaz, Southampton (GB)

(73) Assignee: Atmel Corporation, San Jose, CA (US)

( * ) Notice: Subject to any disclaimer, the term of this patent is extended or adjusted under 35 U.S.C. 154(b) by 1109 days.

(21) Appl. No.: 12/255,335

(22) Filed: Oct. 21, 2008

(65) Prior Publication Data

US 2010/0139991 A1 Jun. 10, 2010

(51) Int. Cl.
*G06F 3/041* (2006.01)

(52) U.S. Cl.
USPC .......................................... 345/173

(58) Field of Classification Search
USPC .......................................... 345/173
See application file for complete search history.

(56) References Cited

U.S. PATENT DOCUMENTS

| 6,452,514 | B1 | 9/2002 | Philipp | |
|---|---|---|---|---|
| 7,643,011 | B2* | 1/2010 | O'Connor et al. | 345/173 |
| 7,663,607 | B2 | 2/2010 | Hotelling | |
| 7,875,814 | B2 | 1/2011 | Chen | |
| 7,920,129 | B2 | 4/2011 | Hotelling | |
| 8,031,094 | B2 | 10/2011 | Hotelling | |
| 8,031,174 | B2 | 10/2011 | Hamblin | |
| 8,040,326 | B2 | 10/2011 | Hotelling | |
| 8,049,732 | B2 | 11/2011 | Hotelling | |
| 8,179,381 | B2 | 5/2012 | Frey | |
| 2004/0160426 | A1* | 8/2004 | DeGroot et al. | 345/173 |
| 2005/0083313 | A1* | 4/2005 | Hardie-Bick | 345/177 |
| 2005/0088406 | A1* | 4/2005 | Chang et al. | 345/156 |
| 2006/0071911 | A1* | 4/2006 | Sullivan | 345/173 |

(Continued)

FOREIGN PATENT DOCUMENTS

| WO | 00/44018 A1 | 7/2000 |
|---|---|---|
| WO | WO-0044018 A1 | 7/2000 |
| WO | WO 2012/129247 | 9/2012 |

OTHER PUBLICATIONS

"International Application Serial No. PCT/US2009/061538, Search Report mailed Apr. 6, 2010", 4 pgs.

(Continued)

*Primary Examiner* — Quan-Zhen Wang
*Assistant Examiner* — Tony Davis
(74) *Attorney, Agent, or Firm* — Baker Botts LLP

(57) ABSTRACT

Noise reduction in a one- or two-dimensional capacitive sensor array is achieved by rejecting and re-acquiring noisy signals. The sensor array is formed of crossed X and Y lines for drive and sense functions respectively, each of the X lines being driven in turn to acquire a full frame of data from the sensor array. A controller actuates the X lines in turn and, for each X line, charge is transferred to charge measurement capacitors connected to respective ones of the Y lines. The controller measures a signal value from a first one of the measurement capacitors, and then tests if that Y signal value has a magnitude lying within an acceptable range. If not, the measurement capacitors are all reset without their signal values being measured, and the controller re-drives the same X line to initiate another charge transfer into the measurement capacitors for that X line. It is then attempted once again to acquire Y signal values for that X line. Noisy signal values are thus rejected, and the sensor re-acquires substitute signal values. This is distinct from the approach of acquiring data and then reprocessing it to remove or suppress noisy data as in the prior art.

21 Claims, 6 Drawing Sheets

(56) References Cited

U.S. PATENT DOCUMENTS

| | | |
|---|---|---|
| 2006/0138574 A1* | 6/2006 | Saito et al. .................... 257/417 |
| 2006/0267953 A1* | 11/2006 | Peterson et al. .............. 345/173 |
| 2007/0262969 A1* | 11/2007 | Pak ............................... 345/173 |
| 2008/0061800 A1 | 3/2008 | Reynolds et al. |
| 2008/0143684 A1* | 6/2008 | Seo ............................... 345/173 |
| 2008/0158169 A1 | 7/2008 | O'Connor et al. |
| 2008/0165154 A1* | 7/2008 | Kim .............................. 345/173 |
| 2009/0284490 A1* | 11/2009 | Chen ............................. 345/174 |
| 2009/0315854 A1 | 12/2009 | Matsuo |
| 2011/0025634 A1* | 2/2011 | Krah et al. .................... 345/173 |
| 2011/0157076 A1* | 6/2011 | Chang et al. ................. 345/174 |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |

OTHER PUBLICATIONS

"International Application Serial No. PCT/US2009/061538, Written Opinion mailed Apr. 6, 2010", 7 pgs.

U.S. Appl. No. 61/454,936, filed Mar. 21, 2011, Myers.

U.S. Appl. No. 61/454,950, filed Mar. 21, 2011, Lynch.

U.S. Appl. No. 61/454,894, filed Mar. 21, 2011, Rothkopf.

* cited by examiner

NOISE REDUCTION IN CAPACITIVE TOUCH SENSORS

BACKGROUND OF THE INVENTION

The present invention relates to noise reduction in a capacitive touch sensor for detecting proximity and location of a body, more especially to a one- or two-dimensional capacitive sensor of the so-called active type which is based on measuring the capacitive coupling between two electrodes at each sensing node in a detector array.

There are various forms of touch sensitive controls which use a capacitive sensor to sense the presence of a body such as a user's finger. A form of touch sensitive control is disclosed in WO-00/44018. In this example a pair of electrodes are provided which act as a key so that the presence of a body such as a user's finger is detected as a result of a change in an amount of charge which is transferred between the two electrodes. With this arrangement, one of the electrodes (labelled X) is driven with a drive circuit and the other of the pair of electrodes (labelled Y) is connected to a charge measurement circuit which detects an amount of charge present on the Y plate when driven by the X plate. As disclosed in WO-00/440018 several pairs of electrodes can be arranged to form a matrix of sensing areas which can provide an efficient implementation of a touch sensitive two-dimensional position sensor. Such two dimensional capacitive transducing (2DCT) sensors are typically used with devices which include touch sensitive screens or touch sensitive keyboards/keypads which are used in, for example, consumer electronic devices and domestic appliances.

Devices employing 2DCT sensors have become increasingly popular and common not only in conjunction with personal computers but also in all manner of other appliances such as personal digital assistants (PDAs), point of sale (POS) terminals, electronic information and ticketing kiosks, kitchen appliances and the like. 2DCT sensors are frequently preferred to mechanical switches for a number of reasons. For example, 2DCT sensors require no moving parts and so are less prone to wear than their mechanical counterparts. 2DCT sensors can also be made in relatively small sizes so that correspondingly small, and tightly packed keypad arrays can be provided. Furthermore, 2DCT sensors can be provided beneath an environmentally sealed outer surface/cover panel. This makes their use in wet environments or where there is a danger of dirt or fluids entering a device being controlled attractive. In addition, manufactures often prefer to employ interfaces based on 2DCT sensors in their products because such interfaces are often considered by consumers to be more aesthetically pleasing than conventional mechanical input mechanisms (e.g. push-buttons).

Other devices which may incorporate 2DCT sensors include pen-input tablets and encoders used in machinery for feedback control purposes, for example 2DCT sensors are capable of reporting at least a 2-dimensional coordinate, Cartesian or otherwise, related to the location of an object or human body part by means of a capacitance sensing mechanism.

Although touch sensitive capacitive sensors such as those described above and disclosed in the above-mentioned disclosures have been successfully deployed in many applications, some applications can present a challenging environment for detecting a change in charge as a result of the presence of a body.

For example, the use of a touch sensor on a mobile phone can create a technical problem because there is a variety of disturbing noise signals produced by radio frequency radiation, by radio frequency signals and by modulators within the mobile phone. Similarly, a liquid crystal display (LCD) has characteristic switching noise as a result of switching and refreshing pixels. Other types of display may have their own forms of characteristic impulsive noise related to pixel scanning and refresh. Sinusoidal noise, such as that produced by mains electricity may also be present, which can affect the amount of charge detected on a key. This may be significant, for example, when a hand held device such as a mobile telephone is being charged through the mains.

FIG. 7 of the accompanying drawings shows an example of sinusoidal noise in the form of a plot of signal strength or amplitude which may be voltage or charge measured with respect to time. As shown various points 220 are shown to indicate points at which burst measurements are taken for a touch sensor such as those described above. As will be appreciated, as a result of sinusoidal noise, the amount of charge transferred from a key by a measurement capacitor of the measurement circuit such as those described above will vary and therefore could in some circumstances cause a false measurement of the presence of a body.

FIG. 8 shows another form of noise, namely rectangular or impulsive noise, i.e. noise having high frequency components, such as that which might be produced by switching the pixels in a LCD display with which the touch panel is integrated. A plot of signal strength with respect to time is shown with sampling points 220, which might be produced by bursts of measurement cycles in a measurement circuit such as those described above. If a measurement cycle coincides with a rising edge of a noise impulse 222, as may arise from an LCD switching event, then an erroneous measurement can be produced which can again cause a touch sensor to erroneously detect the presence of a body.

FIG. 9 illustrates this situation showing simultaneous sinusoidal and rectangular noise. As will be appreciated, in general, both sinusoidal noise and rectangular noise may be present during a given time period. Moreover, by its nature, the amount of noise as well as its frequency components will often vary over time.

Prior art capacitive sensors adopt a variety of signal processing techniques to noise filter the acquired signals. For example, boxcar averagers and detection integrators have been used in the past. In principle other types of standard filtering could be used, and may have been used, such as slew rate filters, high frequency pass filters, low frequency pass filters and band pass filters.

However, choosing the appropriate filter is difficult in view of the inherent unpredictability and variability of noise. Even if the frequency of the main noise components can be predicted, their magnitude over time may be unpredictable. Moreover, in real time applications, such as touch data processing, any filtering needs to be rapid. On the other hand, with touch data processing, it is generally desirable for the signal to be pre-processed "on chip", i.e. in the same chip as is used to receive the touch data from the touch panel, rather than at a higher system level, i.e. on a personal computer or other electronic system with a state of the art central processing unit. Typically, the raw touch data are initially processed by a microcontroller with severely limited numerical processing and memory specifications, but it is nevertheless desirable to ensure that the microcontroller takes measures to reduce noise in the touch data supplied to higher level system components.

SUMMARY OF THE INVENTION

According to the invention there is provided a capacitive touch sensor for detecting proximity and location of a body, the sensor comprising: one or multiple X lines; a plurality of Y lines each arranged to have a portion thereof adjacent to a portion of each of the X lines to form a plurality of sensing capacitors; a charge measurement capacitor connected to each Y line; one or more drive circuits arranged to drive respective ones of the X lines to enable charge transfer from the sensing capacitors associated with that X line to the respective measurement capacitors connected to the Y lines; and a controller operable to actuate respective ones of the X lines via their respective drive circuits, and to measure a signal value from each of the measurement capacitors indicative of the amount of charge transferred, the controller being configured such that, when seeking to measure a set of Y signal values from a particular X line, a test is applied to at least the first Y signal value measured which tests if the Y signal value has a magnitude lying outside an acceptable range, wherein responsive to said test, if the Y signal value lies outside the acceptable range, then the same X line is re-actuated to initiate another charge transfer into the measurement capacitors for that X line.

The invention takes the approach of rejecting noisy signal values and re-acquiring substitute signal values. This is distinct from the approach of acquiring data and then reprocessing it to remove or suppress noisy data as in the prior art. These prior art noise reduction techniques may be beneficially applied in combination with the approach of the invention, but their task will be made easier by the rejection of noisy data at source and its replacement at source with substitute non-noisy data.

Considerable acquisition time is saved, since if the first Y line shows a noisy signal, the other Y lines will also be corrupted, because all the Y lines will have been driven by a common X line at the same time. Rejection of the X line data at the first Y line, therefore saves the time that would otherwise be taken by the controller to process the other (n–1) Y line signals, allowing the device to spend this time instead reacquiring fresh data for the same X line.

The test may be applied only to the first Y signal value measured on the basis that, if the first Y signal value has a signal level indicative of no noise being present, then it is likely the other Y signal values are also not corrupted, since the charging of the charge measurement capacitor for each Y line took place during the same time window.

The acceptable range may have only an upper limit, only a lower limit, or preferably both, so that any signal value below the lower limit and/or above the upper limit is deemed to be unacceptable.

In embodiments of the invention, if the test establishes that the Y signal value lies outside the acceptable range, then the controller does not measure any other as-yet unmeasured Y signal values from the same set, since this is unnecessary, and to do so would simply waste time. The controller can then proceed to discharge all the measurement capacitors in preparation for a new charge transfer.

The invention also provides a method of detecting proximity and location of a body to a touch panel with a capacitive touch sensor comprising: one or multiple X lines and a plurality of Y lines, each Y line being arranged to have a portion thereof adjacent to a portion of each of the X lines to form a plurality of sensing capacitors; a charge measurement capacitor connected to each Y line; one or more drive circuits arranged to drive respective ones of the X lines; and a controller operable to measure signal values from the charge measurement capacitors, the method comprising:

a) driving one of the X lines to enable charge transfer from the sensing capacitors associated with that X line to the respective measurement capacitors connected to the Y lines;

b) measuring a signal value from one of the measurement capacitors; and c) testing if the Y signal value has a magnitude lying within an acceptable range, and if not re-driving the same X line to initiate another charge transfer into the measurement capacitors for that X line.

Preferably, Step b) is applied only to the first Y signal value measured from a given X line.

The invention is particularly beneficial for two dimensional touch sensors with an m×n grid of X and Y lines, such as are used as overlays for displays or other touch panels. In particular, the invention avoids the situation where a considerable amount of time is wasted obtaining a frame of touch data relating to an m×n grid, and the data on one of the X lines is noisy and the integrity of the frame is thus compromised. The invention therefore avoids a frame being compromised as a result of noise being present on only 1/m of the frame, and instead spends a little more time replacing the corrupted X line with good data.

The invention may also be applied to a one dimensional touch sensor, such as a circular wheel, such as a scroll wheel, or a linear slider, i.e. a one-dimensional array of 1×n sensing nodes.

It will be appreciated that the invention as defined above relates to capacitive sensors of the so-called active type, i.e. those based on measuring the capacitive coupling between two electrodes (rather than between a single sensing electrode and a system ground). The principles underlying active capacitive sensing techniques are described in U.S. Pat. No. 6,452,514.

The invention may also be applied to so-called passive or single ended type capacitive sensors, i.e. those that rely on measuring the capacitance of a sensing electrode to a system reference potential (earth). The principles underlying this technique are described in U.S. Pat. No. 5,730,165 and U.S. Pat. No. 6,466,036, for example, the contents of which are incorporated herein in their entirety. According to this alternate form of the invention there is provided a capacitive touch sensor for detecting proximity and location of a body, the sensor comprising: a plurality of sensing nodes distributed over a sensitive area to form a plurality of sensing capacitors; a charge measurement capacitor connected to each sensing capacitor; and a controller operable to measure a signal value from each of the measurement capacitors indicative of the amount of charge transferred from the sensing capacitors at each sensing node, the controller being configured such that, when seeking to measure a set of signal values from the sensitive area, a test is applied to at least the first signal value measured which tests if the signal value has a magnitude lying outside an acceptable range, wherein responsive to said test, if the signal value lies outside the acceptable range, then the same sensing node is re-actuated to initiate another charge transfer into the measurement capacitors for that sensing node.

BRIEF DESCRIPTION OF THE DRAWINGS

For a better understanding of the invention, and to show how the same may be carried into effect, reference is now made by way of example to the accompanying drawings, in which:

FIG. 1b is an example illustration of a user's finger disposed proximate the sensor of FIG. 1a;

DETAILED DESCRIPTION

Figure 1A:
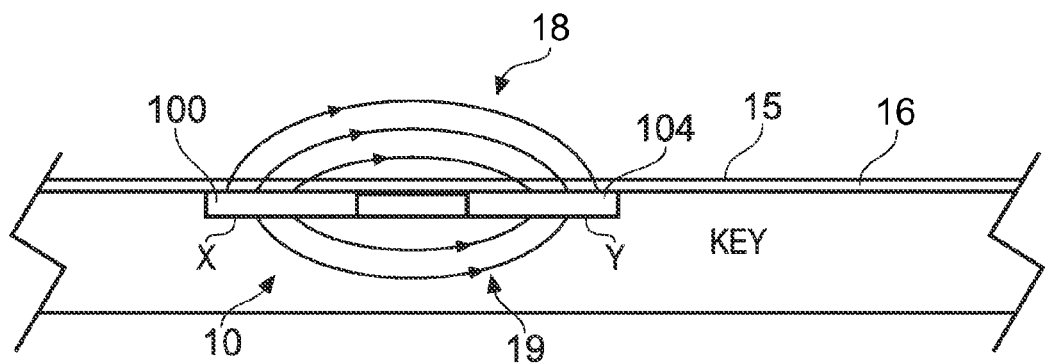
FIG. 1a is a schematic block diagram providing an a touch sensitive sensor.

FIG. 1a is a schematic cross-section through a touch sensitive control panel 15 in the absence of an actuating body, typically a user's finger or stylus.

Figure 1B:
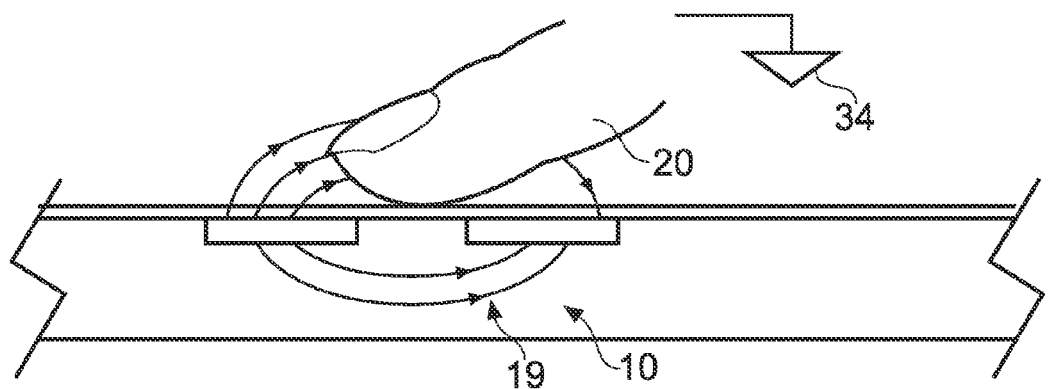

FIG. 1b corresponds to FIG. 1a, but shows the same cross-section in the presence of an actuating body in the form of a user's finger.

The touch sensor shown in FIGS. 1a and 1b correspond to an example in which a pair of transverse electrodes form a touch sensor. As shown in FIG. 1a a pair of electrodes 100, 104 which form a drive or X plate and a receiving or Y plate in the following description are disposed beneath the surface of a touch sensitive control panel 15. The electrodes 100, 104 are disposed beneath a dielectric layer 16, for example a glass or plastics panel. As shown in FIGS. 1a and 1b the touch sensor 10 is arranged to detect the presence of a body such as a user's finger 20 as a result of a change in an amount of charge transferred from the Y plate 104. As shown in FIG. 1a when the X plate 100 is charged or driven by a circuit, an electric field is formed which is illustrated by the lines 18 and 19 both above and below the touch panel surface 15 as a result of which charge is transferred to the Y plate 104. The X plate and the Y plate 100, 104 form a capacitively chargeable sensing node 10, referred to as a key in the following. As shown in FIG. 1b as a result of the disturbance of the electric field 18 due to the presence of the user's finger 20 the electric field above the surface of the control panel 15 is disturbed as a result of an earthing or grounding effect provided by the user's finger 20 as illustrated schematically by ground 34.

Figure 2:
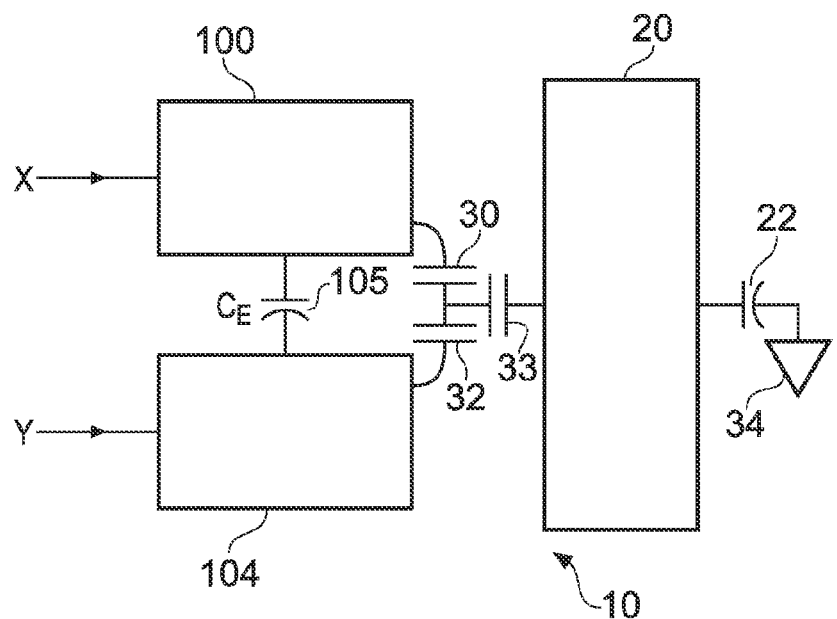
FIG. 2 is a schematic block diagram illustrating an electrical equivalent of the touch sensor shown in FIG. 1b.

An equivalent circuit diagram of the touch sensor shown in FIGS. 1a and 1b is shown in FIG. 2. In FIG. 2 equivalent capacitances are illustrated in the form of a circuit diagram. A capacitance formed between the X plate 100 and the Y plate 104 of the key is a capacitance CE 105 (sometimes also referred to as Cx in the art) which is in effect a coupling capacitor. The presence of the body 20 has an effect of introducing shunting capacitances 30, 32, 33 which are then grounded via the body 20 by an equivalent grounding capacitor 22 to the ground 34. Thus the presence of the body 20 affects the amount of charge transferred from the Y plate of the key and therefore provides a way of detecting the presence of the body 20. This is because the capacitance between the X plate 100 and the Y plate 104 of the key CE 105 reduces as the grounding capacitances 22, 30, 32, 33 increases.

It will be appreciated by the skilled person that FIGS. 1a and 1b are depicting a so-called active capacitive sensors based on measuring the capacitive coupling between two electrodes (rather than between a single sensing electrode and a system ground). The principles underlying active capacitive sensing techniques are described in U.S. Pat. No. 6,452,514. In an active-type sensor, one electrode, the so called drive electrode, is supplied with an oscillating drive signal. The degree of capacitive coupling of the drive signal to the sense electrode is determined by measuring the amount of charge transferred to the sense electrode by the oscillating drive signal. The amount of charge transferred, i.e. the strength of the signal seen at the sense electrode, is a measure of the capacitive coupling between the electrodes. When there is no pointing object near to the electrodes, the measured signal on the sense electrode has a background or quiescent value. However, when a pointing object, e.g. a user's finger, approaches the electrodes (or more particularly approaches near to the region separating the electrodes), the pointing object acts as a virtual ground and sinks some of the drive signal (charge) from the drive electrode. This acts to reduce the strength of the component of the drive signal coupled to the sense electrode. Thus a decrease in measured signal on the sense electrode is taken to indicate the presence of a pointing object.

Figure 3:
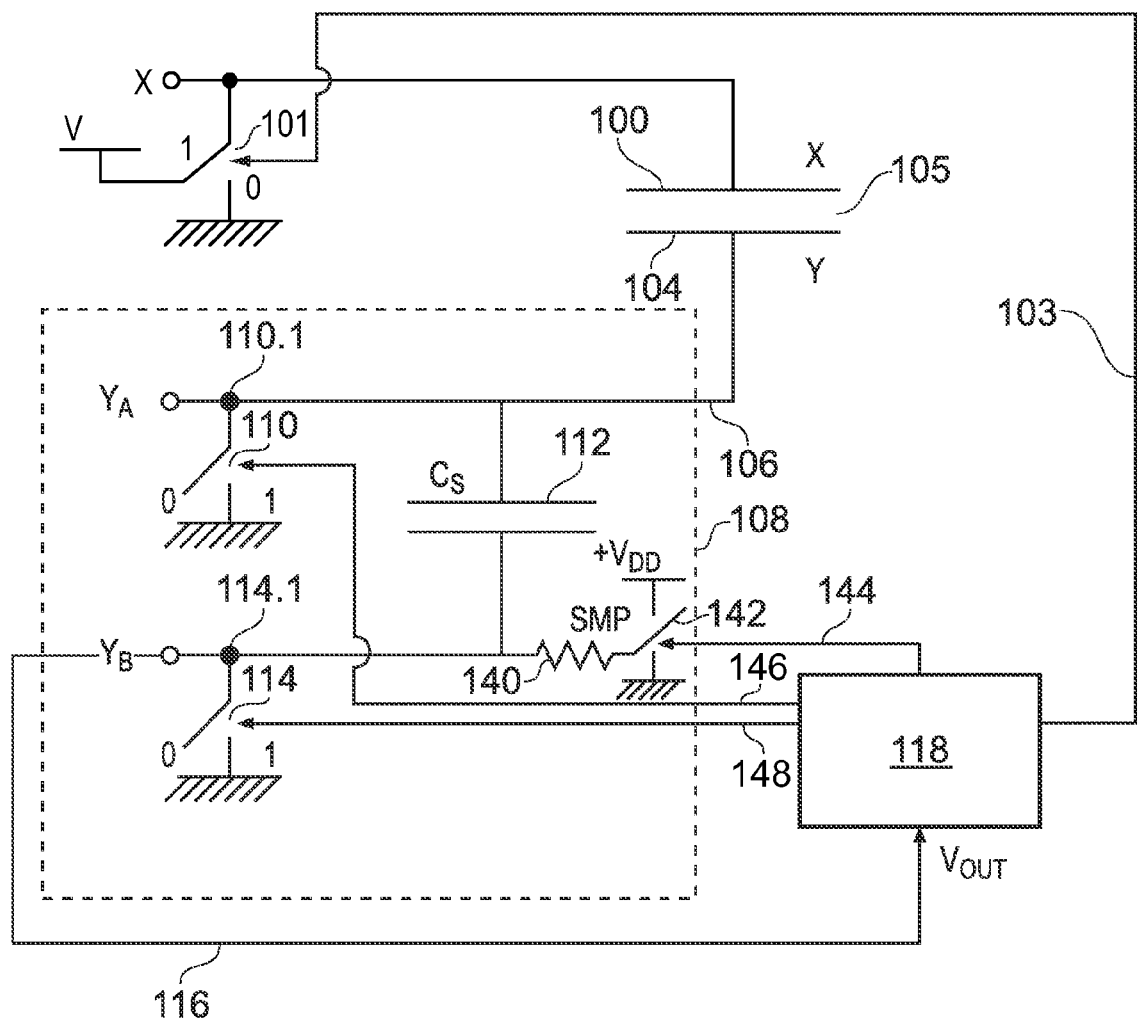
FIG. 3 is a schematic block diagram of a circuit which in combination with the touch sensor shown in FIG. 1b serves to form a touch sensor.

FIG. 3 provides a circuit diagram, which forms a touch sensor by sensing an amount of charge transferred from the X plate 100 shown in FIG. 2 to the Y plate 104 and includes a charge measurement circuit which has been reproduced from WO-00/44018, which corresponds to U.S. Pat. No. 6,452,514.

As shown a drive circuit 101 is connected to the X plate 100 of the key and the Y plate 104 of the key is connected to an input 106 of a charge measurement circuit 108, wherein the X and Y plates collectively form the capacitor 105. The input 106 is connected to a first controllable switch 110 and to one side of a measuring capacitor Cs 112 on which charge is accumulated as a measure of capacitive coupling. The other side of the measurement capacitor 112 is connected via a second switch 114 to an output 116 of the measurement circuit 108 which is fed as a voltage VOUT to a controller 118. A first input control channel 103 is used to control the operation of the drive circuit 101.

In the illustrated circuit diagram, a convention has been adopted whereby a control input of each of the switches 110, 114 is open when the control input is "0" and closed when the control input is "1". The other side of each of the switches 110, 114 is connected to ground, so that if the control input is "1" then the connecting input would be connected to ground. A similar convention has been adopted for drive circuit 101, whereby when the control input 103 is "0" the X plate is connected to ground and when the control input is "1" the X plate is connected to a reference voltage "V".

Figure 4:
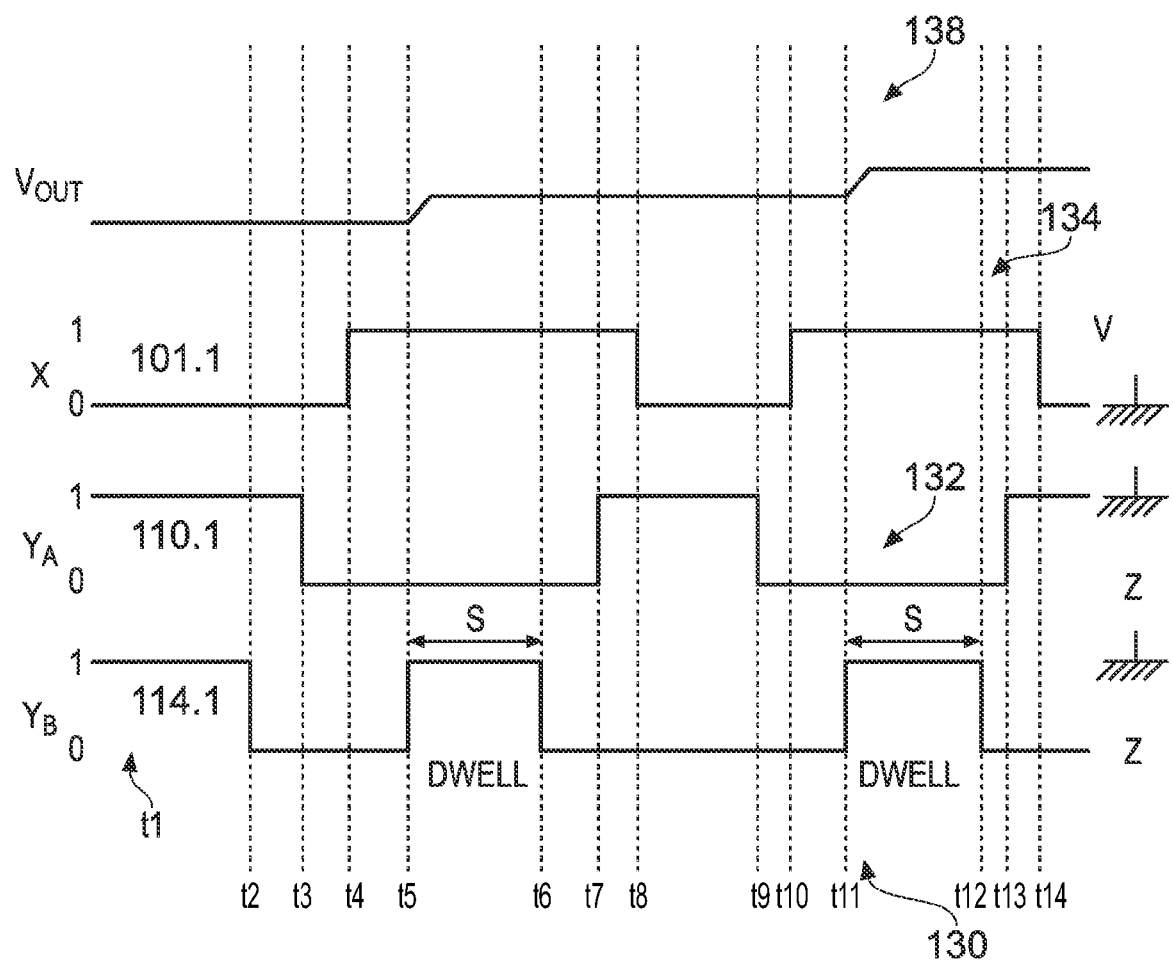
FIG. 4 is an example timing diagram illustrating the operation of the sensing circuit shown in FIG. 3.

FIG. 4 is a timing diagram which shows operation of the touch sensor, and in particular the function of the measurement circuit arranged to measure the amount of charge transferred from the X plate 100 to the Y plate 104 of the key 10.

Four timing diagrams 130, 132, 134, 138 are shown to illustrate the operation of the measurement circuit 108 shown in FIG. 3. A first timing diagram 130 represents the control input applied to the second switch 114. Thus, on the left hand side, the logical value of the control input is shown, whereas on the right hand side the effect at the connecting point 114.1 is shown to be either "Z" in which the connecting point 114.1 is isolated or floating, or for a logical control input of 1 grounded. Similarly a timing diagram 132 illustrates for logical control input values "0" or "1" of a connecting point 110.1 at either floating (Z) or ground (0). A third timing diagram 134 shows a relative timing of a drive signal provided to the X plate 100 of the key in which case, in contrast to the timing diagrams 130, 132 for the two switches 110, 114, the value of the timing diagram is an absolute value so that the left hand side illustrates that the voltage varies between 0V and the reference voltage, which is the voltage used to charge the X plate 100. The final timing diagram 138 provides an illustration of the example signal strength or voltage produced on the measurement capacitor 112 as a result of the opening and closing of the switches 110, 114 and the driving of the X plate 100 in accordance with the timing illustrated by the timing diagrams 130, 132, 134. The timing diagrams 130, 132, 134, 138 will now be explained as follows:

At a first time t1, the charge measurement circuit 108 is initialised, i.e. reset, using control lines 146 and 148 for respective switches 110 and 114 being high (1) and control line 103 for drive circuit 101 being low (0). Control lines 146, 148, 103 are lines connected to the controller 118. The Y plate 104, the X plate 100 and the charge measurement capacitor 112 are thus set to ground. Correspondingly, the output voltage across the charge measurement circuit 112 is at zero. It will be appreciated that connections to ground and VDD could be reversed in other embodiments.

At a second time t2 the logical input to the control switch 114 is set to zero thereby opening the switch and floating the connecting point 114.1, which connects the output voltage 116 to one side of the measurement capacitor 112.

At a third time t3 the control input to the switch 110 is set low (0), thereby floating the connecting point 110.1 which is YA before, at a time t4, the control input 103 of the drive circuit 101 is set high (1), thereby the X plate 100 of the key 10 is connected to the reference voltage "V". Then in order to charge the measurement capacitor Cs for a period S between t5 and t6, the control input to the switch 114 is set high (1) thereby grounding YB to transfer charge induced on the Y plate 104 of the key 10 onto the charge measurement capacitor 112, until t6 when the control input to the switch 114 is set to low (0), which again floats the connecting point 114.1. The period between t5 and t6 is called the dwell period. After charging the measurement capacitor Cs for a first dwell time between t5 and t6, at t7 the control input to switch 110 is set high (1), thereby grounding the connecting point 110.1, which is connected to the other side of the charge measurement capacitor Cs 112. As a result, the voltage across the measurement capacitor can be measured. The amount of charge transferred from the Y plate 104 onto the measurement capacitor Cs 112 during the dwell period between t5 and t6 is represented as the output voltage VOUT.

At time t8 the control input 103 to the drive circuit 101 goes low (0), thereby the X plate 100 of the key 10 is connected to ground which concludes a first measurement cycle.

At time t9 the next measurement cycle of a measurement burst occurs. At t9 the control input to the switch 110 goes low (0) thereby floating YA, before the control input 103 to the drive circuit 101 again goes high (1), thereby connecting the X plate 100 to the reference voltage "V", at time t10. A further packet of charge is then transferred to the measurement capacitor 112 from the Y plate 104 of the sampling capacitor where it is accumulated with charge transferred in previous cycles. As with the first burst, at point t11 the control input to the switch 114 goes high (1) thereby grounding the point 114.1 and driving charge onto the measurement capacitor until t12, when the control input to the switch 114 goes low, again floating YB. Thus again charge is transferred from the Y plate 104 during the dwell period between t11 and t12, thereby increasing the voltage across the measurement capacitor Cs as represented as the output voltage VOUT. At t13 the control input to the switch 110 is set high (1) thereby grounding YA and at t14 control input 103 to the drive circuit 101 goes low (0), thereby connecting the X plate 100 of the key 10 to ground which concludes the second measurement cycle. Thus, as with the first measurement cycle an amount of charge has been transferred from the Y plate, which has then increased the voltage across the measurement capacitor 112, which represents an amount of charge transferred from the Y plate.

After several measurement cycles of a burst, the amount of charge present on the Y plate transferred to the measurement capacitor 112 is consistent, thereby providing a representation of charge present on the key produced by the drive signal to the X plate 100 via the drive circuit 101. The amount of charge on the measurement capacitor 112 is determined with the aide of a discharge resistor 140. One side of the discharge resistor 140 is connected to the measurement capacitor and the other side SMP is connected to a discharge switch 142. The discharge switch 142 receives a control signal from the controller 118 via a control channel 144. The controller 118 is controlled so as to ground SMP, during measurement cycles and to discharge the measurement capacitor Cs 112 through the discharge resistor 140 by connecting SMP to a voltage VDD. The controller 118 then determines an amount of charge present by counting a number of predetermined clock periods before the charge on the measurement capacitor Cs is discharged to zero. The number of clock periods therefore provides a relative signal sample value for the respective measured charge signal.

In alternative embodiments, instead of arranging for the controller 118 to generate a predetermined number of measurement cycles and then measuring the charge present on the Y plate, the controller may operate to continue with the measurement bursts until a predetermined threshold voltage is reached. The number of measurement cycles or bursts of cycles which are required to reach the predetermined threshold then provides an indication of the amount of charge transferred from the X plate to the Y plate and therefore an indication of the electric coupling between them. Hence the presence of a body proximate the coupling will change the electric coupling and therefore the number of cycles required to reach the threshold, which can therefore be detected by the controller.

Using the same principles of construction and operation, a matrix or grid of touch sensitive switches can be formed to provide a 2DCT sensor. A user can then at a given time select one, or in some cases a plurality of, positions on a sensitive area.

Figure 5:
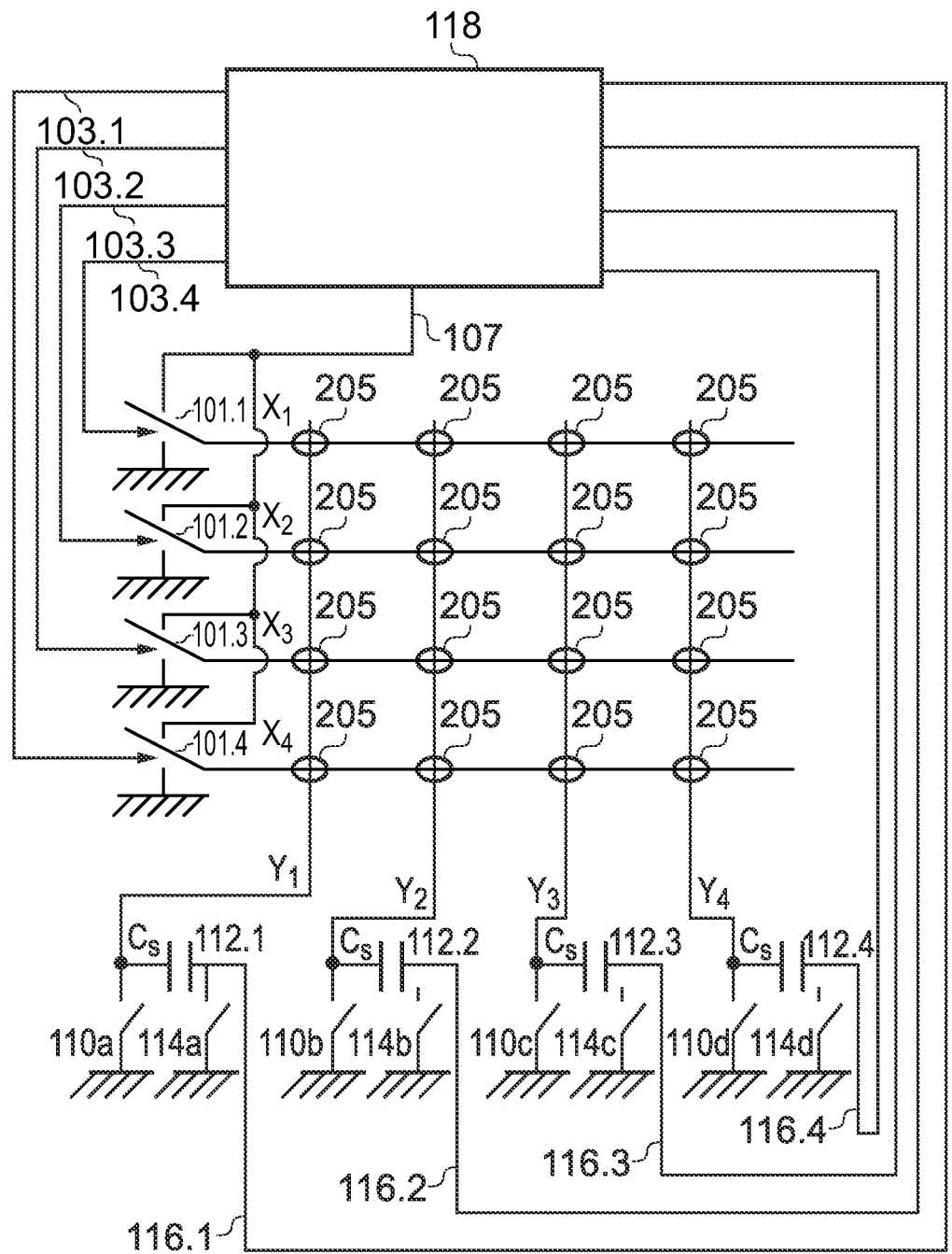
FIG. 5 is a circuit diagram illustrating a touch sensitive matrix providing a two-dimensional capacitive transducing sensor arrangement according to an embodiment of the invention.

FIG. 5 shows a two dimensional touch sensor employing an array of sensors of the kind described with respect to FIGS. 3 and 4. The charge measurement circuit 108 is used in conjunction with drive circuits 101.1, 101.2, 101.3, 101.4 and is arranged to drive different sensor points 205. As shown each of the drive circuits 101.1, 101.2, 101.3, 101.4 is controlled by the controller 118 to drive each of the corresponding lines X1, X2, X3, X4, using first control inputs 103.1, 103.2, 103.3, 103.4 in the same way as the X plate 100 is driven in FIG. 3 and represented in FIG. 4. An input 107 is also shown which provides the reference voltage "V".

The output of the coupling capacitors at each of the points 205 are connected to one side of measuring capacitors Cs 112.1, 112.2, 112.3, 112.4 which are arranged to measure an amount of charge present on the Y plate, Y1, Y2, Y3, Y4 providing output signals 116.1, 116.2, 116.3, 116.4 to detect the presence of an object in the same way as the operation of the circuit shown in FIG. 3 and FIG. 4. This is achieved by applying control signals to the switches 110a, 110b, 110c, 110d, 114a, 114b, 114c, 114d in a corresponding manner to the arrangement explained above with reference to FIGS. 3 and 4.

In FIG. 5, some of the detail from FIG. 3 has been omitted for clarity. In particular the resistor 140, its switch 142 and actuating line 144 are not shown. It is noted that each of the switches 142 can be commonly actuated by a single actuating line 144 from the controller 118, since they only need to be switched together to perform their function described above. Alternatively, if hardware is available, the capacitor Cs can be measured in parallel by multiple 'SMP' resistors.

More details for the operation of such a matrix circuit are disclosed in WO-00/44018.

The controller operates as explained above to detect the presence of an object above one of the matrix of keys 205, from a change in the capacitance of the keys, through a change in an amount of charge induced on the key during a burst of measurement cycles. However, the presence of a noise signal can induce charge onto the keys of a touch sensor and provide a false detection or prevent a detection being made.

Figure 6:
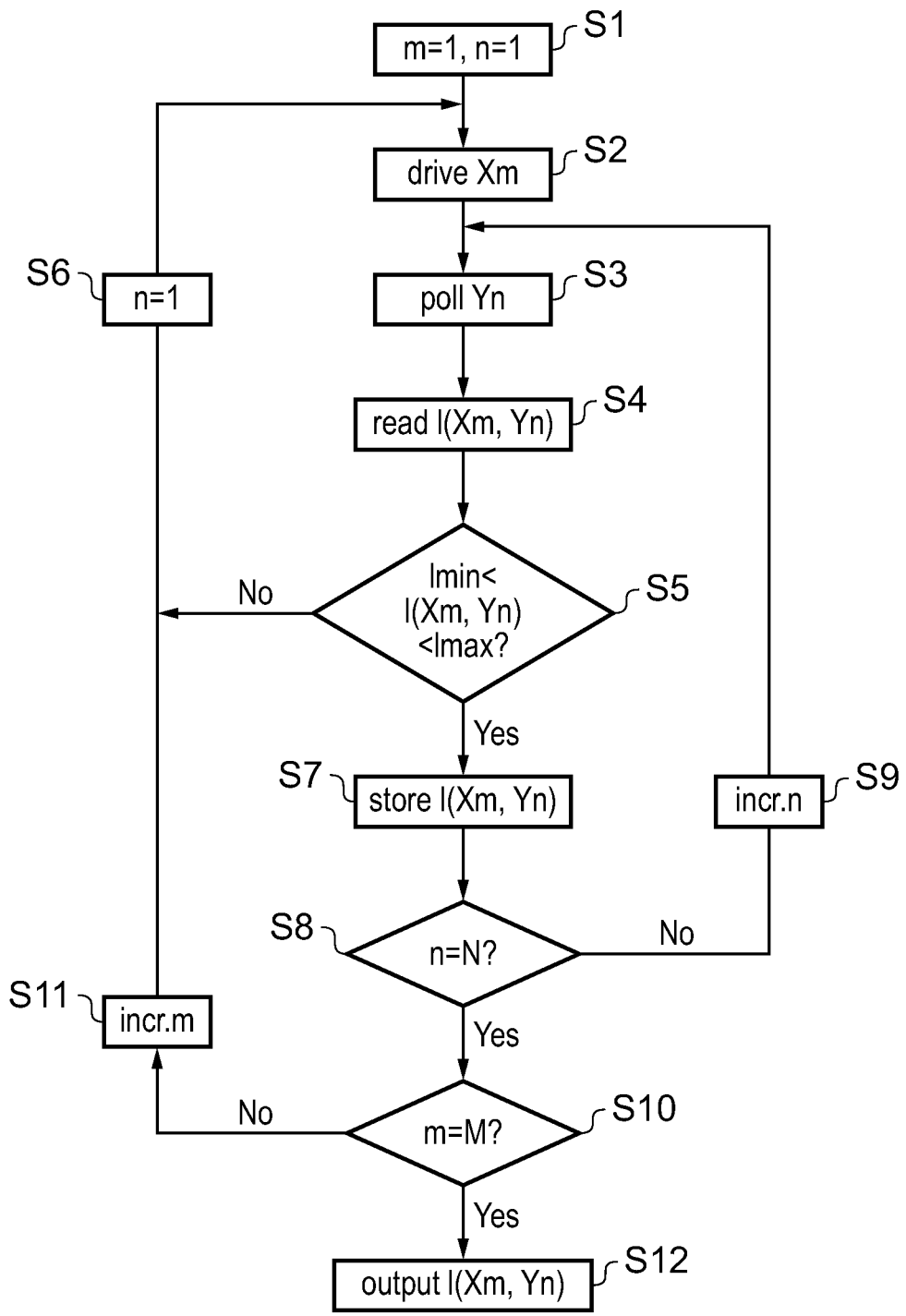
FIG. 6 is a flow diagram showing the process flow for acquiring a frame of touch data from the circuit of FIG. 5.
Figure 7:
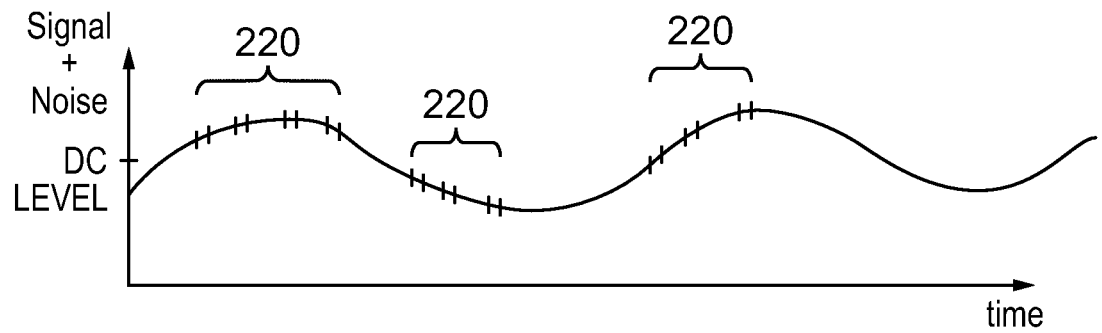
FIG. 7 is a plot of signal strength with respect to time representing a voltage or charge present on a sensing key which has been affected by sinusoidal noise, such as mains noise.
Figure 8:
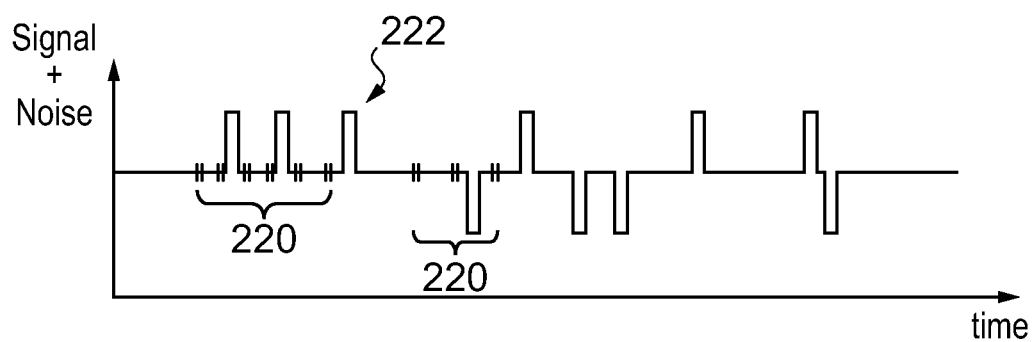
FIG. 8 is a plot of signal strength with respect to time representing the voltage or charge on a sensing key in the presence of rectangular noise, such as LCD noise.
Figure 9:
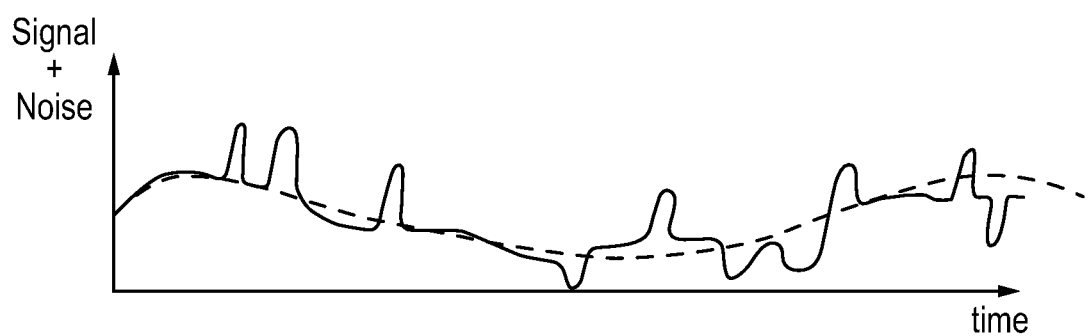
FIG. 9 is a plot of signal strength with respect to time representing the voltage or charge on a sensing key in the presence of sinusoidal and rectangular noise.

FIG. 6 is a flow diagram showing the process flow for acquiring a frame of touch data according to an embodiment of the invention using the above described circuit. The flow diagram is generalised to a touch sensor grid having an arbitrary number of X and Y lines. There are 'M' X lines: $X_1, X_2 \ldots X_m \ldots X_M$. Moreover, there are 'N' Y lines: $Y_1, Y_2 \ldots Y_n \ldots Y_N$. It is to be assumed unless stated otherwise that the logical functions of the process are driven from the controller 118, for example by running an application in the controller 118, the code being stored for example in non-volatile memory in the controller 118. Further, it is to be assumed unless stated otherwise that the process parameters, such as the counters, are stored in the controller 118, for example in registers of a microprocessor that forms part of the controller 118.

Step S1 shows the first step in acquiring a frame which is to initialise counters for the X and Y lines to m=1 and n=1.

In Step S2, the mth X line is driven, i.e. $X_1$ in the first instance. Here it will be assumed that the X lines are driven in sequence 1 to M. However, the drive order is arbitrary and has no bearing on the functionality. Referring to FIG. 5, the controller 118 drives the line 103.4 to effect the drive of the $X_1$ line.

In Step S3, the nth Y line is sampled or polled from the relevant one of the input lines 116.n. In the first instance $Y_1$ is polled. The polling order is arbitrary and has no bearing on the functionality. The controller 118 selects the Y line to be polled by a multiplexer (not shown) internal to the controller.

In Step S4, the signal value I of the sensing node (m, n) which is denoted as I(Xm, Yn) is read by the controller. Referring to FIG. 5, the signal value is read by receiving output from the charge measurement circuit 108 at input connection through the respective connecting line 116.n.

In Step S5 a logical test is applied to ascertain whether the signal value is greater than a minimum threshold value and/or less than a maximum threshold value. In the following it is assumed that both minimum and maximum thresholds are tested for, but optionally only one of these could be tested. The logical test is therefore:

$$I\text{min} < I(Xm, Yn) < I\text{max}$$

If the condition is not satisfied, the process flow jumps back to redo Step S2 after resetting the counter for the Y lines, i.e. setting n=1 in this example, which is Step S6. Referring to FIG. 5, the controller will close all the switches 110n, 114n to discharge the charge accumulation capacitors Cs 112n ready to start a new cycle, i.e. return to time t1 in FIG. 4. The same X line is then re-driven and the sequential polling of the Y lines through the controller's internal multiplexer is attempted again.

Optionally, the test of Step S5 can be selectively applied only to one of the Y lines per X line, conveniently only for the first y line, i.e. when n=1 in this example. The logical test would then be:

$$I\text{min} < I(Xm, Yn) < I\text{max} \text{ and } n=1$$

If the condition is satisfied, processing of the acquired frame of touch data continues.

In Step S7 the signal value I(Xm, Yn) is stored in the controller 118 pending completion of processing of the frame.

In Step S8 it is tested whether n=N.

If n<>N then n is incremented in Step S9 and process flow returns to Step S3 to poll the next Y line.

If n=N then all Y lines have been read out from a particular X line, and flow proceeds.

In Step S1 it is tested whether m=M.

If m<>M then m is incremented in Step S11 and process flow returns to Step S2 to drive the next X line.

If m=M then all X lines have been driven and acquisition of the frame has been completed, i.e. a full touch data set has been acquired from the m×n sensing nodes that make up the array.

In Step S12 the full frame of touch data comprising signal values I(Xm, Yn) has now been validated and is suitable for use as a touch data set by further processing. This further processing may be carried out within the controller before subsequent output to another device, such as a higher system level, for example a controlling personal computer or similar CPU-based system. Alternatively, the touch data set of the frame may be directly output from the controller without further processing. It is noted that reference to a complete frame does not necessarily mean that there will be signal values for all m and n, but this will be the case for standard modes of use. Typically, some further processing will take place on the controller and then more remotely "off chip".

The process flow will then repeat either synchronously or asynchronously depending on the implementation to collect touch data sets over a sequence of time intervals.

The further processing might initially be signal processing to reduce noise, followed by touch tracking to follow touches over a sequence of frames, perhaps followed by gesture recognition processing to identify, presses, taps, double taps, drawing, flicks, or any other gesture.

It will thus be appreciated that the method of the invention takes the approach of rejecting noisy signal values and re-acquiring them. This is distinct from the approach of acquiring data and then reprocessing it to remove or suppress noise effects. However, we do not generally advocate only following the approach of rejecting noisy signal values and re-acquiring them, but rather it will in most cases be preferable to follow the approach of rejecting noisy signal values and re-acquiring them, and then also applying conventional reprocessing, the advantage being that better quality data is input into the reprocessing algorithms. In some cases, if the noise in the frames of data supplied according to the method of FIG. 6 is sufficiently low, the post processing may decide not to apply some or all of the filters available, thereby speeding up the data processing.

Considerable acquisition time is saved, since if the first Y line shows a noisy signal, the other Y lines will also be corrupted. This is because all the Y lines will have been driven at the same time, so assuming the noise is temporally localised, as opposed to spatially localised, then they will all have experienced the same noise. Referring to FIG. 4, any noise in the dwell time will corrupt all the Y lines. Rejection of the X line data at the first Y line, therefore saves the time that would otherwise be taken by the controller to process the other (n−1) Y line signals, allowing the device to spend this time instead reacquiring fresh data for the same X line. For example, if the second sample of a given X line provides acceptable data after the first sample has been rejected at the time of processing the first Y line, the additional time taken to acquire data for that X line is only the time taken to acquire 1/nth of an X line. The cost/benefit of the invention therefore increases with the number of Y lines, where cost is time.

The minimum and maximum thresholds Imin and Imax are preferably set to levels that have regard to signal values of a typical touch, i.e. as offsets below and above a suitable reference value. They may be set in the factory as part of device testing and configuration, or they may be set by the device itself in normal use, e.g. on initialisation, or periodically during frame acquisition, for example every 'j' frames, where j might be for example 10, 50 or 100.

For example, if a normal touch results in a signal value of 30, then Imin and Imax could be set a certain amount above and below the normal signal value. This could be set having regard to statistical spread of normal signal values, e.g. using standard deviation, for example 1 or 2 standard deviations above and below the average normal signal value. Alternatively it could be set more simply either always at a fixed amount above and below the normal signal value, e.g. 10 in this example, or for example by an amount calculated to be a fraction of the way from the normal signal value to zero, or to a noise level, or to a detect threshold. In concrete, if the normal signal value is 30 and the thresholds are set having regard to zero, it might be decided to select them at an absolute of half way to zero which would mean values of 15 and 45, i.e. 30±15. Similarly, if the noise level is 6, and the thresholds are selected mid-way to the noise level, then they would be, 18 and 42, i.e. 30±12. It may also be desirable to set the thresholds asymmetrically about the normal signal value. Typically, it would be desirable for Imax to be closer to the normal signal value than Imin, for example twice as close, e.g. Imin=10 and Imax=40 about a normal signal value of 30. The value of Imin should of course be set at above the noise level.

Preferably, the thresholds are set adaptively based on ambient noise levels, or average noise, so that the method only forces re-acquisition of a minority of the data. Clearly, if the thresholds provide too narrow a pass band, at some point the entire function of the device will be suppressed, since touch data will never be output. On the other hand, if the thresholds provide too wide a pass band, then at some point no benefit will be derived, since individual X line data will always be accepted without re-acquisition. It will be appreciated that there are standard methods for measuring average noise or ambient noise in touch data as well as more generally for any data.

Another method of adaptively adjusting the thresholds is based on the numbers of rejections. If too high a proportion of the samples are being rejected as lying outside the acceptable range, then the range can be increased.

The method may also be modified from that described above by limiting the number of rejections, for example by incorporating a counter in the rejection path of the process flow in series with Step S6, which has a saturation value after which no further rejections are permitted for the frame, or for some other number of frames or fixed time interval, i.e. the test of Step S5 is temporarily disabled.

The invention therefore provides a simple method for avoiding corruption of frame data by noise. This is important given that noise in only one part of a frame of data will tend to compromise the interpretation of the whole frame.

Although the invention has been described with reference to an example of a two dimensional touch sensor with an m×n grid of sensing nodes, the invention may also be applied to a one dimensional touch sensor, such as a circular wheel, a scroll wheel, or a linear slider, i.e. a one-dimensional array of 1×n sensing nodes.

In summary, noise reduction in a one- or two-dimensional capacitive sensor array is achieved by rejecting and re-acquiring noisy signals. The sensor array is formed of crossed X and Y lines for drive and sense functions respectively, each of the X lines being driven in turn to acquire a full frame of data from the sensor array. A controller actuates the X lines in turn and, for each X line, charge is transferred to charge measurement capacitors connected to respective ones of the Y lines. The controller measures a signal value from a first one of the measurement capacitors, and then tests if that Y signal value has a magnitude lying within an acceptable range. If not, the measurement capacitors are all reset without their signal values being measured, and the controller re-drives the same X line to initiate another charge transfer into the measurement capacitors for that X line. It is then attempted once again to acquire Y signal values for that X line. Noisy signal values are thus rejected, and the sensor re-acquires substitute signal values. This is distinct from the approach of acquiring data and then reprocessing it to remove or suppress noisy data as in the prior art.

What is claimed is:

1. A touch sensor comprising:
a first set of electrodes, the first set of electrodes arranged in at least three groupings of electrodes, each grouping of the at least three groupings of electrodes of the first set of electrodes extending along a first axis;
a second set of electrodes, the second set of electrodes arranged in at least three groupings of electrodes, each grouping of the at least three groupings of electrodes of the second set of electrodes extending along a second axis different than the first axis, each electrode of the second set of electrodes arranged to have a portion thereof adjacent to a portion of each of the first set of electrodes such that the second set of electrodes is capacitively coupled to the first set of electrodes; and
one or more non-transitory electronic storage media comprising code that, when executed, is configured to:
cause a first drive signal to be sent to a first grouping of electrodes of the first set of electrodes;
determine a first measurement associated with a first grouping of electrodes of the second set of electrodes after causing the first drive signal to be sent to the first grouping of electrodes of the first set of electrodes, the first measurement related to the first drive signal;
compare the first measurement to a limit;
determine that the first measurement is within the limit;
in response to determining that the first measurement is within the limit, determine a second measurement associated with a second grouping of electrodes of the second set of electrodes;
compare the second measurement to the limit;
determine that the second measurement is outside the limit;
in response to determining that the second measurement is outside the limit, determine not to measure an effect of the first drive signal on a third grouping of electrodes of the second set of electrodes; and in response to determining that the second measurement is outside the limit, cause a second drive signal to be sent to the first grouping of electrodes of the first set of electrodes.

2. The sensor of claim 1, wherein the code is configured to:

determine a set of measurements associated with the at least three groupings of electrodes of the second set of electrodes after causing the second drive signal to be sent to the first grouping of electrodes of the first set of electrodes;

determine that the first set of measurements are within the limit; and in response to determining that the set of measurements are within the limit, determine a location of a touch using the set of measurements.

3. The sensor of claim 1, wherein:

the limit is an upper limit; and the code is configured to determine that the second measurement is outside the limit by determining that the second measurement is above the upper limit.

4. The sensor of claim 1, wherein:

the limit is a lower limit; and the code is configured to determine that the second measurement is outside the limit by determining that the second measurement is below the lower limit.

5. The sensor of claim 1, wherein the code is configured to determine that the second measurement is outside the limit by determining that the second measurement is outside a range.

6. The sensor of claim 1, wherein the code is further configured to:

determine a set of measurements associated with the at least three groupings of electrodes of the second set of electrodes after causing the second drive signal to be sent to the first grouping of electrodes of the first set of electrodes;

determine that the first set of measurements are within the limit; and in response to determining that the set of measurements are within the limit, cause a third drive signal to be sent to a second grouping of electrodes of the first set of electrodes.

7. The sensor of claim 1, wherein the code is further configured to cause discharging of at least one capacitor associated with the second set of electrodes in response to determining that the second measurement is outside the limit.

8. A method comprising:

causing a first drive signal to be sent to a first grouping of electrodes of a first set of electrodes, the first set of electrodes arranged in at least three groupings of electrodes, each grouping of the at least three groupings of electrodes of the first set of electrodes extending along a first axis, the at least three groupings of electrodes of the first set of electrodes comprising the first grouping of electrodes of the first set of electrodes;

determining a first measurement associated with a first grouping of electrodes of a second set of electrodes after causing the first drive signal to be sent to the first grouping of electrodes of the first set of electrodes, the second set of electrodes arranged in at least three groupings of electrodes, the at least three groupings of electrodes of the second set of electrodes comprising the first grouping of electrodes of the second set of electrodes, each grouping of the at least three groupings of electrodes of the second set of electrodes extending along a second axis different than the first axis, each electrode of the second set of electrodes arranged to have a portion thereof adjacent to a portion of each of the first set of electrodes such that the second set of electrodes is capacitively coupled to the first set of electrodes, the first measurement related to the first drive signal;

comparing the first measurement to a limit;

determining that the first measurement is within the limit;

in response to determining that the first measurement is within the limit, determining a second measurement associated with a second grouping of electrodes of the second set of electrodes;

comparing the second measurement to the limit;

determining that the second measurement is outside the limit;

in response to determining that the second measurement is outside the limit, determining not to measure an effect of the first drive signal on a third grouping of electrodes of the second set of electrodes; and in response to determining that the second measurement is outside the limit, causing a second drive signal to be sent to the first grouping of electrodes of the first set of electrodes.

9. The method of claim 8, further comprising:

determining a set of measurements associated with the at least three groupings of electrodes of the second set of electrodes after causing the second drive signal to be sent to the first grouping of electrodes of the first set of electrodes;

determining that the first set of measurements are within the limit; and in response to determining that the set of measurements are within the limit, determining a location of a touch using the set of measurements.

10. The method of claim 8, wherein:

the limit is an upper limit; and determining that the second measurement is outside the limit comprises determining that the second measurement is above the upper limit.

11. The method of claim 8, wherein:

the limit is a lower limit; and determining that the second measurement is outside the limit comprises determining that the second measurement is below the lower limit.

12. The method of claim 8, wherein determining that the second measurement is outside the limit comprises determining that the second measurement is outside a range.

13. The method of claim 8, further comprising:

determining a set of measurements associated with the at least three groupings of electrodes of the second set of electrodes after causing the second drive signal to be sent to the first grouping of electrodes of the first set of electrodes;

determining that the first set of measurements are within the limit; and in response to determining that the set of measurements are within the limit, causing a third drive signal to be sent to a second grouping of electrodes of the first set of electrodes.

14. The method of claim 8, further comprising causing the discharge of at least one capacitor associated with the second set of electrodes in response to determining that the second measurement is outside the limit.

15. One or more non-transitory electronic storage media comprising code that, when executed, is configured to:

cause a first drive signal to be sent to a first grouping of electrodes of a first set of electrodes, the first set of electrodes arranged in at least three groupings of electrodes, each grouping of the at least three groupings of electrodes of the first set of electrodes extending along a first axis, the at least three groupings of electrodes of the first set of electrodes comprising the first grouping of electrodes of the first set of electrodes;

determine a first measurement associated with a first grouping of electrodes of a second set of electrodes after causing the first drive signal to be sent to the first grouping of electrodes of the first set of electrodes, the second set of electrodes arranged in at least three groupings of electrodes, the at least three groupings of electrodes of the second set of electrodes comprising the first grouping of electrodes of the second set of electrodes, each grouping of the at least three groupings of electrodes of the second set of electrodes extending along a second axis different than the first axis, the first measurement related to the first drive signal, each electrode of the second set of electrodes arranged to have a portion thereof adjacent to a portion of each of the first set of electrodes such that the second set of electrodes is capacitively coupled to the first set of electrodes;

compare the first measurement to a limit;

determine that the first measurement is within the limit;

in response to determining that the first measurement is within the limit, determine a second measurement associated with a second grouping of electrodes of the second set of electrodes;

compare the second measurement to the limit;

determine that the second measurement is outside the limit;

in response to determining that the second measurement is outside the limit, determine not to measure an effect of the first drive signal on a third grouping of electrodes of the second set of electrodes; and in response to determining that the second measurement is outside the limit, cause a second drive signal to be sent to the first grouping of electrodes of the first set of electrodes.

16. The media of claim 15, wherein the code is further configured to:

determine a set of measurements associated with the at least three groupings of electrodes of the second set of electrodes after causing the second drive signal to be sent to the first grouping of electrodes of the first set of electrodes;

determine that the first set of measurements are within the limit; and in response to determining that the set of measurements are within the limit, determining a location of a touch using the set of measurements.

17. The media of claim 15, wherein:

the limit is an upper limit; and the code is configured to determine that the second measurement is outside the limit by determining that the second measurement is above the upper limit.

18. The media of claim 15, wherein:

the limit is a lower limit; and the code is configured to determine that the second measurement is outside the limit by determining that the second measurement is below the lower limit.

19. The media of claim 15, wherein the code is configured to determine that the second measurement is outside the limit by determining that the second measurement is outside a range.

20. The media of claim 15, wherein the code is further configured to:

determine a set of measurements associated with the at least three groupings of electrodes of the second set of electrodes after causing the second drive signal to be sent to the first grouping of electrodes of the first set of electrodes;

determine that the first set of measurements are within the limit; and in response to determining that the set of measurements are within the limit, cause a third drive signal to be sent to a second grouping of electrodes of the first set of electrodes.

21. The media of claim 15, wherein the code is further configured to cause discharging at least one capacitor associated with the second set of electrodes in response to determining that the second measurement is outside the limit.

* * * * *